(12) United States Patent
Kakinuma et al.

(10) Patent No.: US 9,030,251 B2
(45) Date of Patent: May 12, 2015

(54) MIXER

(75) Inventors: Yuji Kakinuma, Tokyo (JP); Masato Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/114,365

(22) PCT Filed: Sep. 7, 2012

(86) PCT No.: PCT/JP2012/072833
§ 371 (c)(1),
(2), (4) Date: Oct. 28, 2013

(87) PCT Pub. No.: WO2013/038992
PCT Pub. Date: Mar. 21, 2013

(65) Prior Publication Data
US 2014/0043086 A1 Feb. 13, 2014

(30) Foreign Application Priority Data

Sep. 16, 2011 (JP) ................................. 2011-202506

(51) Int. Cl.
*G06F 7/44* (2006.01)
*H03D 7/16* (2006.01)
(Continued)

(52) U.S. Cl.
CPC .................. *H03D 7/16* (2013.01); *H01L 43/08* (2013.01); *H03D 7/00* (2013.01)

(58) Field of Classification Search
CPC ....................................................... G06G 7/44
USPC ............................ 327/355–361; 455/323, 326
See application file for complete search history.

(56) References Cited

U.S. PATENT DOCUMENTS 7,808,229 B2 * 10/2010 Koga et al. ................ 324/117 R
7,825,658 B2    11/2010 Koga et al.
(Continued)

FOREIGN PATENT DOCUMENTS

JP         2009-246615      10/2009
JP         A-2010-278713    12/2010
(Continued)

OTHER PUBLICATIONS

Tulapurkar et al. "Nature." International Weekly Journal of Science, Nov. 17, 2005, vol. 438, pp. 339-342.
(Continued)

*Primary Examiner* — Dinh Le
(74) *Attorney, Agent, or Firm* — Oliff PLC (57) ABSTRACT

A frequency converter, capable of obtaining resonance characteristics having a high Q factor and a high multiplication signal and having a narrow-band frequency selectivity function, is provided by the following configuration. A magnetoresistance effect element includes a pinned magnetization layer, a free magnetization layer, and a non-magnetic spacer layer disposed between the pinned magnetization layer and the free magnetization layer. In response to an input of a high frequency signal and a local signal, the magnetoresistance effect element generates a voltage signal (multiplication signal) by multiplying the signals by each other using a magnetoresistance effect. A magnetic field generated by a magnetic-field applying unit is applied to the free magnetization layer of the magnetoresistance effect element in a direction perpendicular to a film surface direction or by tilting an angle of the magnetic field from the film surface direction toward a direction perpendicular to the film surface direction.

16 Claims, 5 Drawing Sheets (51) Int. Cl.
*H01L 43/08* (2006.01)
*H03D 7/00* (2006.01)

(56) References Cited

U.S. PATENT DOCUMENTS

| | | | |
|---|---|---|---|
| 7,986,544 B2* | 7/2011 | Kent et al. | 365/148 |
| 7,991,377 B2 | 8/2011 | Kakinuma et al. | |
| 8,019,315 B2 | 9/2011 | Kakinuma et al. | |
| 8,131,249 B2 | 3/2012 | Maehara | |
| 8,391,106 B2 | 3/2013 | Shimazawa et al. | |
| 8,583,073 B2 | 11/2013 | Kakinuma et al. | |
| 2008/0180085 A1 | 7/2008 | Koga et al. | |
| 2009/0140733 A1 | 6/2009 | Koga et al. | |
| 2009/0243698 A1* | 10/2009 | Kakinuma et al. | 327/356 |
| 2010/0264959 A1 | 10/2010 | Maehara | |
| 2010/0301919 A1 | 12/2010 | Kakinuma et al. | |
| 2011/0026156 A1 | 2/2011 | Shimazawa et al. | |
| 2011/0051481 A1 | 3/2011 | Maehara | |
| 2012/0025926 A1 | 2/2012 | Kakinuma et al. | |
| 2013/0222092 A1 | 8/2013 | Nakada et al. | |

FOREIGN PATENT DOCUMENTS

| | | |
|---|---|---|
| JP | A-2011-009551 | 1/2011 |
| JP | A-2011-181756 | 9/2011 |

OTHER PUBLICATIONS

Susuki et al. "Microwave Properties of Spin Injection Devices." 2007, vol. 2, No. 6, pp. 282-290.

U.S. Appl. No. 14/114,383 in the name of Kakinuma et al. filed Oct. 28, 2013.

U.S. Appl. No. 14/114,373 in the name of Kakinuma et al. filed Oct. 28, 2013.

* cited by examiner

MIXER

TECHNICAL FIELD

The present invention relates to a mixer for generating multiplication signals by using a magnetoresistance effect element.

BACKGROUND ART

These days, frequency bands allocated to wireless communication are becoming saturated. As measures to deal with this situation, dynamic access concept, which is referred to as "radio opportunistic system (radio-opportunistic)" or "cognitive communication", is being studied. The principle of this concept is to analyze a frequency spectrum, to avoid a busy occupied frequency bandwidth, to identify and determine an available non-occupied frequency bandwidth, and to change the communication method. However, in order to implement this dynamic frequency access, an ultra-wideband oscillator and a tunable filter are required.

Generally, the reception performance (sensitivity and selectivity) of portable terminals is dependent on a band-pass filter and a mixer. In particular, in order to effectively utilize frequency bandwidths and to implement energy-saving radio telecommunication, a band-pass filter having a high Q factor (Q factor indicates the state of resonance, and as the Q factor is higher, the resonance is more stable) is demanded. As the requirements for a tunable filter, the center frequency can be shifted, and control for increasing or decreasing the passband is necessary. At present, existing oscillation resonators, such as SAW (Surface Acoustic Wave: surface acoustic wave element, and more specifically, a filter element utilizing surface acoustic waves propagating on the surface of a piezoelectric body) and BAW (Bulk Acoustic Wave: a filter element utilizing resonant oscillation of a piezoelectric film itself called bulk acoustic waves) do not satisfy such requirements for a tunable filter. On the other hand, however, a compact tunable band-pass filter which can be fit in a portable terminal has not yet been realized.

As a magnetoresistance effect element, a TMR (Tunnel Magnetoresistive) element is known in which a spacer layer formed of a non-magnetic material is interposed between a pinned magnetization layer and a free magnetization layer. In this TMR element, when a current flows, spin polarized electrons flow and the orientation of magnetization (the orientation of electron spin) of the free magnetization layer changes in accordance with the number of spin polarized electrons stored within the free magnetization layer. In the free magnetization layer disposed in a fixed magnetic field, when the orientation of magnetization is changed, torque acts on electron spin so that the orientation of magnetization will restore to a stable direction constrained by the magnetic field, and oscillation called spin precession occurs when electron spin is oscillated by a specific force.

Recently, the following phenomenon was discovered. When a high-frequency AC current flows into a magnetoresistance effect element, such as a TMR element, strong resonance occurs (spin torque ferromagnetic resonance) when the frequency of the AC current flowing in a free magnetization layer coincides with the number of oscillations of spin precession in which electron spin is returned to the orientation of magnetization (see NPL 1). Moreover, a magnetoresistance effect element is known to exhibit the following function under the following situation. A static magnetic field is externally applied to a magnetoresistance effect element, and the direction of this static magnetic field is tilted within a pinned magnetization layer at a certain angle with respect to the direction of the magnetization of the pinned magnetization layer. In this state, when an RF current (RF current having a frequency which coincides with the number of oscillations of spin precession (resonant frequency)) is input into the magnetoresistance effect element, the magnetoresistance effect element is known to exhibit a function of generating a DC voltage proportional to the square of the amplitude of the input RF current across the magnetoresistance effect element. That is, the magnetoresistance effect element exhibits a square law detecting function (spin torque diode effect). It is also known that this square law detection output of the magnetoresistance effect element exceeds a square law detection output of a semiconductor pn junction diode under certain conditions (see NPL 2).

The applicant of this application has focused on the square law detecting function of a magnetoresistance effect element and studied the application of such a magnetoresistance effect element to a mixer which is operable with low local power, and has already proposed such a mixer (see PTL 1). A mixer using a magnetoresistance effect element includes a magnetic-field applying unit that applies a magnetic field to the above-described free magnetization layer, and when a first high frequency signal S1 and a second high frequency signal S2 for a local signal are input, the mixer generates a multiplication signal S4 due to a magnetoresistance effect. However, the multiplication signal S4 considerably attenuates if it directly passes through a 50-$\Omega$ matching circuit. Accordingly, the applicant of this application has proposed that an impedance circuit (a filter, a capacitor, or an active element) is inserted between an input transmission line through which the first high frequency signal S1 and the second high frequency signal S2 are transmitted and the above-described magnetoresistance effect element so that the impedance for the multiplication signal S4 will become higher than the impedance for the first high frequency signal S1 and the second high frequency signal S2 (see PTL 2).

Although the characteristics of a mixer using the above-described magnetoresistance effect element are known, a high frequency device that can apply such characteristics to an industrial use is still unknown. Accordingly, the discovery of the application of such characteristics to an industrial use has been expected. The applicant of this application has found that, by using the square law detecting function of a magnetoresistance effect element, a multiplication signal output increases and decreases in accordance with resonance characteristics and the frequency selective function is exhibited. However, a high Q factor has not been obtained, and the frequency selection range is too wide, and thus, the applicant of this application has not yet found the application of the above-described characteristics to an industrial use.

CITATION LIST

Non Patent Literature

NPL 1: Nature, Vol. 438, 17 Nov. 2005, pp. 339-342
NPL 2: Magnetics Japan, Vol. 2, No. 6, 2007, pp. 282-290
PTL 1: Japanese Unexamined Patent Application Publication No. 2009-246615
PTL 2: Japanese Unexamined Patent Application Publication No. 2010-278713

SUMMARY OF INVENTION

Technical Problem

As a result of continuously conducting study of the above-described mixer, the applicant of this application has found that a square law detection output (signal level of a multiplication signal in the mixer) obtained due to the magnetoresistance effect is largely dependent on resonance characteristics of a magnetoresistance effect element. It is expected that the level of a multiplication signal will be increased if the Q factor of the resonance characteristics is increased, and at the same time, the performance of a filter with improved frequency selectivity is also expected for an industrial application. However, there is a technical problem for a method for improving the Q factor of resonance characteristics of a magnetoresistance effect element.

The present invention has been made in order to solve the above-described problem. It is a major object of the present invention to provide a mixer which is operable with low local power while preventing a decrease in an output of a multiplication signal.

Solution to Problem

In order to achieve the above-described object, a mixer according to the present invention includes: a magnetoresistance effect element that includes a pinned magnetization layer, a free magnetization layer, and a non-magnetic spacer layer disposed between the pinned magnetization layer and the free magnetization layer, and that generates, in response to an input of a first high frequency signal and a second high frequency signal for a local signal, a multiplication signal by multiplying both the high frequency signals by each other using a magnetoresistance effect; and a magnetic-field applying unit that applies a magnetic field to the free magnetization layer. The magnetic field generated by the magnetic-field applying unit is applied to a film surface of the free magnetization layer in a direction perpendicular to the film surface of the free magnetization layer so that a magnetization component in a direction perpendicular to the film surface will be provided to the free magnetization layer.

In the mixer according to the present invention, the magnetoresistance effect element and the magnetic-field applying unit may be located so that an angle of the magnetic field generated by the magnetic-field applying unit with respect to the free magnetization layer of the magnetoresistance effect element will be an angle tilted in a range of 5° to 175° from a direction of the film surface toward a direction perpendicular to the direction of the film surface.

In the mixer according to the present invention, resonance characteristics having a Q factor of 100 or higher may be generated in the free magnetization layer by providing a magnetization component applied by the magnetic-field applying unit in a direction perpendicular to the film surface to the free magnetization layer, so that the multiplication signal of the first high frequency signal and the second high frequency signal for the local signal is obtained.

The mixer according to the present invention may further include an impedance circuit in which impedance for the multiplication signal is higher than impedance for the first high frequency signal and the second high frequency signal for a local signal, the impedance circuit being disposed between an input transmission line through which the first high frequency signal and the second high frequency signal for a local signal are transmitted and the magnetoresistance effect element. The impedance circuit may be constituted by any one of a filter (first filter) in which the frequencies of the first high frequency signal and the second high frequency signal for a local signal are included in a passband and frequencies of the multiplication signal are included in an attenuation band, a capacitive element in which self-resonant frequency band is set to be the above-described passband, and a semiconductor amplifier having a 50-Ω input resistance.

The mixer according to the present invention may further include an impedance conversion circuit that inputs the multiplication signal and outputs the multiplication signal with output impedance which matches characteristic impedance of an output transmission line to the output transmission line, input impedance being set to be a value higher than a value of the output impedance.

In the mixer according to the present invention, the magnetic-field applying unit may maintain the strength of the magnetic field at a constant value.

In the mixer according to the present invention, the magnetic-field applying unit may include a current supply unit, wiring for magnetic-field generation, and a magnetic yoke. The magnetic yoke may be constituted by an apex magnetic body and also by lateral magnetic bodies, lower magnetic bodies, and bottom magnetic bodies disposed at both sides of the apex magnetic body. The magnetoresistance effect element is disposed in the vicinity of the bottom magnetic bodies such that it is sandwiched between the bottom magnetic bodies. The magnetoresistance effect element is connected such that a magnetic flux path is closed all around the entire magnetic yoke and the magnetoresistance effect element.

The mixer according to the present invention includes at least one of: a magnetoresistance effect element that generates, in response to an input of a first high frequency signal and a second high frequency signal for a local signal, a multiplication signal by multiplying both the high frequency signals by each other using a magnetoresistance effect; the magnetic-field applying unit that applies a magnetic field to the free magnetization layer of the magnetoresistance effect element; and an impedance circuit in which impedance for the multiplication signal is higher than impedance for the first high frequency signal and the second high frequency signal for a local signal, the impedance circuit being disposed between an input transmission line through which the first high frequency signal and the second high frequency signal for a local signal are transmitted and the magnetoresistance effect element.

A frequency converter including one of the above-described mixers includes a filter (second filter) that allows, when, between the frequencies of both the high frequency signals, a higher frequency signal denotes f1 and a lower frequency signal denotes f2, one of a multiplication signal of a frequency (f1+f2) and a multiplication signal of a frequency (f1−f2) among the multiplication signals to pass through the filter.

In the frequency converter, the second filter is constituted by an amplifier in which the upper limit frequency of an amplifying operation is set between the frequency (f1−f2) of the multiplication signal and the frequency f2.

In the mixer and the frequency converter according to the present invention, a multiplication signal generated by a square law detection operation (mixing operation) using a magnetoresistance effect exhibits a signal strength in accordance with resonance characteristics, and exhibits an attenuation curve in which the maximum peak of the multiplication signal is positioned at the same frequency as that when resonance characteristics are maximized.

In the mixer and the frequency converter according to the present invention, a magnetic field generated by the magnetic-field applying unit is applied to the film surface of the free magnetization layer in a perpendicular direction, thereby providing a perpendicular-direction magnetic field to the free magnetization layer. With this configuration, the magnetoresistance effect element is able to obtain resonance characteristics having a high Q factor and to extract a high multiplication signal.

In the mixer and the frequency converter according to the present invention, a magnetic field generated by the magnetic-field applying unit is applied to the free magnetization layer of the magnetoresistance effect element by tilting an angle of the magnetic field in a range of 5° to 175° from the film surface direction toward a direction perpendicular to the film surface direction. With this arrangement, the magnetoresistance effect element is able to obtain resonance characteristics having a high Q factor and to extract a high multiplication signal.

In the mixer and the frequency converter, the first high frequency signal and the second high frequency signal can be output to the magnetoresistance effect element with only a small attenuation through an impedance circuit providing low impedance. Accordingly, in the mixer, a multiplication signal can be output by multiplying the first high frequency signal by the second high frequency signal for a local signal with smaller power. As a result, power saving can further be enhanced.

Additionally, the impedance circuit provides high impedance in a frequency band of a multiplication signal generated by the magnetoresistance effect element, thereby preventing a decrease (attenuation) in the multiplication signal generated by the magnetoresistance effect element.

In the mixer and the frequency converter, the impedance circuit is constituted by a first filter in which the frequencies of the first high frequency signal and the second high frequency signal are included in a passband and frequencies of the multiplication signal generated by the magnetoresistance effect element are included in an attenuation band. Accordingly, the first filter can be constituted by passive elements. Thus, power saving can further be enhanced than when the impedance circuit is constituted by active elements.

In the mixer and the frequency converter, the first filter is constituted by capacitive elements in which self-resonant frequency band is set to be the above-described passband. Thus, it is possible to increase the simplicity of the mixer and the frequency converter.

In the mixer and the frequency converter, a multiplication signal generated by the magnetoresistance effect element can be input with the input impedance which is set to be higher than the characteristic impedance of an output transmission channel. Thus, the attenuation of the multiplication signal can be prevented, and also, the multiplication signal can be output with the output impedance which matches the characteristic impedance of the output transmission channel. Thus, it is possible to generate a multiplication signal efficiently.

In the mixer and the frequency converter, a permanent magnet, for example, may be used, so that the strength of the magnetic field can be maintained at a constant value. With this configuration, the magnetic-field applying unit can be formed with a simple structure, thereby making it possible to reduce the manufacturing cost.

In the frequency converter, when, between the frequencies of both the high frequency signals, a higher frequency signal denotes f1 and a lower frequency signal denotes f2, a signal of frequency f1, a signal of frequency f2, and multiplication signals of frequencies (f1+f2), (f1−f2), 2×f1, 2×f2, 3×f1, 3×f2, and so on, are output from the mixer. Among these signals, a multiplication signal of a frequency (f1+f2) or a multiplication signal of a frequency (f1−f2) can be generated as a multiplication signal of a desired frequency by using the second filter.

In the frequency converter, the second filter can be constituted by a single amplifier, thereby further increasing the simplicity of the configuration of the frequency converter.

DESCRIPTION OF EMBODIMENTS

An embodiment of a mixer and a frequency converter will be described below with reference to the drawings.

First, the configuration of a mixer 1 and the configuration of a frequency converter 100 including the mixer 1 will be described below with reference to the drawings. An example in which the frequency converter 100 is applied to a receiver RX will be discussed here.

Figure 1:
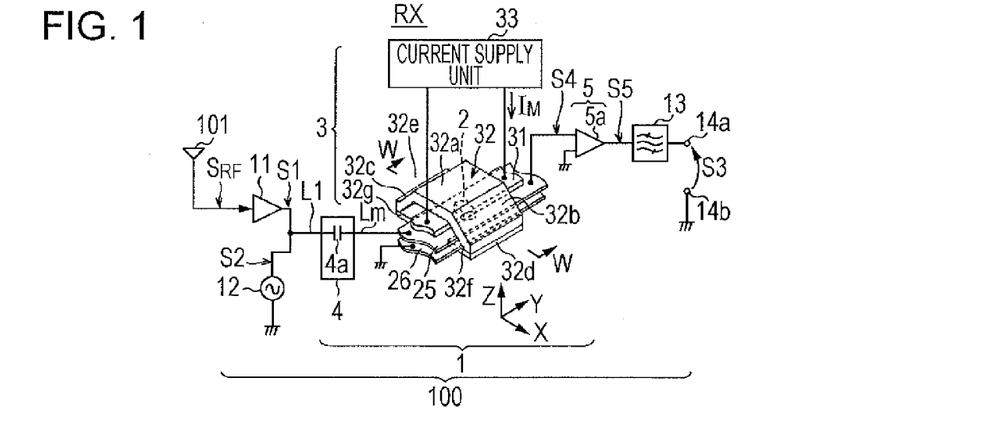
FIG. 1 is a diagram illustrating a configuration of a frequency converter 100.

The frequency converter 100 shown in FIG. 1 forms the receiver RX together with an antenna 101. The frequency converter 100 is disposed at a radio frequency stage of the receiver RX which receives an RF signal $S_{RF}$ output from the antenna 101, and has a function of converting a frequency f1 of the RF signal $S_{RF}$ into a desired frequency of a multiplication signal S3. In one example, the frequency converter 100 includes the mixer 1, an amplifier 11, a signal generator 12, a filter 13, and output terminals 14a and 14b (hereafter also be referred to as an "output terminal 14" if it is not necessary to distinguish the output terminals 14a and 14b from each other). The amplifier 11 receives and amplifies the RF signal $S_{RF}$ and outputs the amplified RF signal $S_{RF}$ as a signal S1 (first high frequency signal). The signal generator 12 functions as a so-called local oscillator and generates a local signal (second high frequency signal) S2 having a frequency f2. In one example, the signal generator 12 generates and outputs a local signal S2 of −15 dBm±5 dBm. The signal S1 and the local signal S2 generated as described above are transmitted to an impedance circuit 4 via a signal transmission line (for example, a microstrip line, hereinafter may also be referred to as a "transmission line") L1 whose characteristic impedance is defined as 50Ω.

Figure 2:
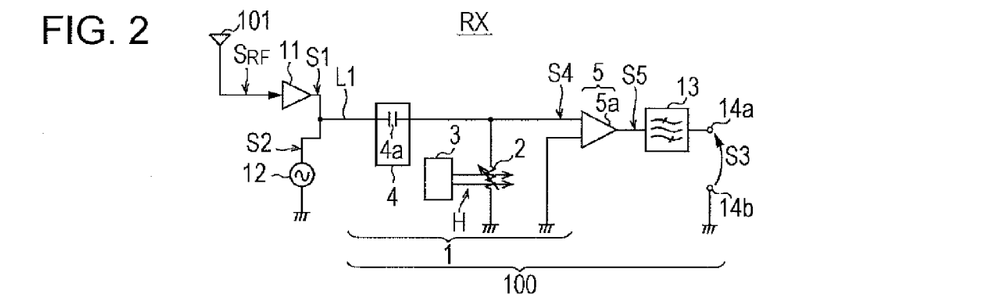
FIG. 2 is an equivalent circuit diagram of a mixer 1.

The mixer 1 includes a magnetoresistance effect element 2, a magnetic-field applying unit 3, the impedance circuit 4, and an impedance conversion circuit 5. The mixer 1 multiplies the signal S1 (frequency f1) output from the amplifier 11 by the local signal S2 (frequency f2) generated by the signal generator 12, and outputs an output signal S5 as multiplication signals. In this case, the output signal S5 includes a signal of the frequency f1, a signal of the frequency f2, and multiplication signals of frequencies (f1+f2), (f1−f2), 2×f1, 2×f2, 3×f1, 3×f2, and so on. The signal generator 12 is not an essential component for the frequency converter 100, and a signal generated by the signal generator 12 may be input, as well as the RF signal $S_{RF}$, from the outside of the frequency converter 100. The mixer 1 shown in FIG. 1 is represented by an equivalent circuit, such as that shown in FIG. 2.

Figure 3:
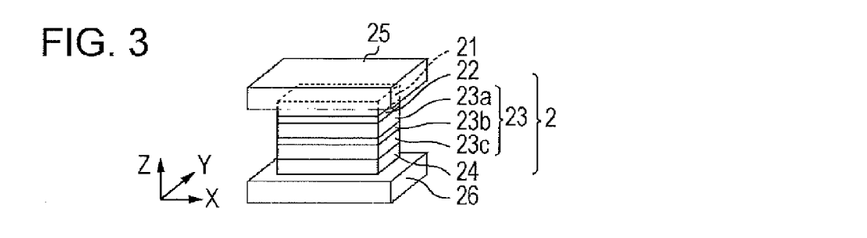
FIG. 3 is a perspective view of an area near a magnetoresistance effect element 2 (TMR element).
Figure 4:
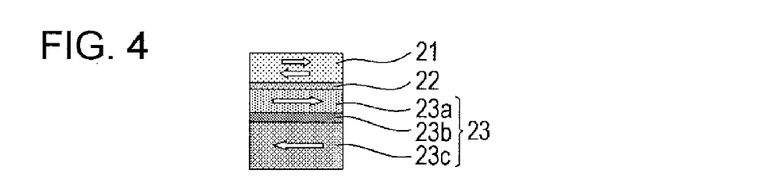
FIG. 4 illustrates magnetization directions of a free magnetization layer 21 and a pinned magnetization layer 23 of the magnetoresistance effect element 2 which are magnetized in in-plane directions according to the present invention.

As the magnetoresistance effect element 2 according to the present invention, the configuration of a TMR element including a free magnetization layer 21 and a pinned magnetization layer 23 magnetized in in-plane directions with respect to a magnetic film surface is shown in FIGS. 3 and 4. More specifically, the magnetoresistance effect element 2 includes the free magnetization layer 21, a spacer layer 22, the pinned magnetization layer 23, and an antiferromagnetic layer 24. In the state in which the layers are stacked on each other in this order, the free magnetization layer 21 and the antiferromagnetic layer 24 are disposed between an upper electrode 25 and a lower electrode 26 such that the free magnetization layer 21 is connected to the upper electrode 25 with a cap layer 25a and one via-hole therebetween and such that the antiferromagnetic layer 24 is connected to the lower electrode 26 with a cap layer 26a and another via-hole therebetween. Via-holes connected to the upper electrode 25 and the lower electrode 26 are not shown in FIG. 1. In this case, the free magnetization layer 21 is formed of a ferromagnetic material as a magnetosensitive layer. The spacer layer 22 is a non-magnetic spacer layer formed of a non-magnetic material having insulation properties, and serves as a tunnel barrier layer. The spacer layer 22 is formed, generally, with a thickness of 1 nm or smaller. The lower electrode 26 is connected to a ground. As a material of the free magnetization layer 21 and the pinned magnetization layer 23, a magnetic metal, such as Fe (iron), Co (cobalt), Ni (nickel), and Cr (chrome), or a magnetic alloy thereof is used. Further, an alloy obtained by mixing B (boron) into a magnetic alloy for decreasing saturation magnetization may be used.

In one example, the pinned magnetization layer 23 includes, as shown in FIG. 3, a ferromagnetic layer (second magnetic layer) 23a in which a magnetization direction is fixed, a non-magnetic layer 23b formed of a metal, such as Ru (ruthenium), and another ferromagnetic layer (first magnetic layer) 23c in which a magnetization direction is fixed opposite to that of the ferromagnetic layer 23a. The layers are stacked on each other in this order such that the ferromagnetic layer 23c is positioned above the antiferromagnetic layer 24. As the multilayer configuration of the pinned magnetization layer 23, a multilayer film structure, such as CoFe (cobalt iron)—Ru (ruthenium)—CoFe (cobalt iron), for example, may be used.

Concerning the magnetoresistance effect element 2, in order to increase the possibility that a greater resonance motion will occur in the free magnetization layer 21, the size of the free magnetization layer 21 is preferably smaller than a 200 nm square, and the element resistance preferably approximates 50Ω in terms of a DC resistance in order to provide matching with a high frequency transmission circuit. The tunnel barrier layer 22 is preferably formed of a monocrystal MgOx (001) layer or a polycrystal MgOx (0<x<1) layer in which preferred orientation is observed in a (001) crystal face (hereinafter such a layer will be referred to as an "MgO layer"). Moreover, a CoFeB (cobalt-iron-boron) interlayer (not shown) is preferably disposed between the tunnel barrier layer 22 and the free magnetization layer 21 having a BCC structure (Body-Centered Cubic Lattice), and a CoFeB (cobalt-iron-boron) interlayer (not shown) is preferably disposed between the tunnel barrier layer 22 and the pinned magnetization layer 23 having a BCC structure. By the provision of a CoFeB interlayer, it is expected that a coherent tunneling effect will be implemented, and a high magnetoresistance change rate can be obtained.

Figure 5A:
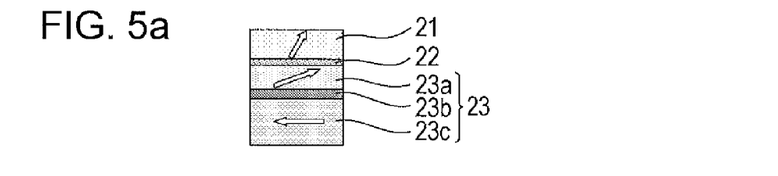
FIG. 5a illustrates magnetization directions of the free magnetization layer 21 and the pinned magnetization layer 23 of the magnetoresistance effect element 2 when a magnetic field H is applied to the magnetoresistance effect element 2.
Figure 5B:
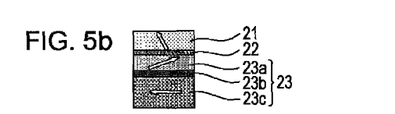
FIG. 5b illustrates magnetization directions of the free magnetization layer 21 and the pinned magnetization layer 23 of the magnetoresistance effect element 2 when a magnetic field H is applied to the magnetoresistance effect element 2.

Magnetization directions of the free magnetization layer 21 and the pinned magnetization layer 23 of the magnetoresistance effect element 2 which are magnetized in in-plane directions are changed and tilted, as shown in FIG. 5a and FIG. 5b, due to an influence of an external magnetic field applied in a perpendicular direction with respect to a film surface. As shown in FIG. 5a, the magnetization direction of the free magnetization layer 21, which is almost parallel to the film surface when a perpendicular-to-plane direction magnetic field H is not applied, is sharply tilted from an in-plane direction toward a perpendicular direction when the perpendicular-to-plane direction magnetic field H is applied. As shown in FIG. 5b, the magnetization direction of the free magnetization layer 21, which is almost antiparallel to the film surface when the perpendicular-to-plane direction magnetic field H is not applied, is sharply tilted from the in-plane direction toward a perpendicular direction when the perpendicular-to-plane direction magnetic field H is applied.

Figure 6:
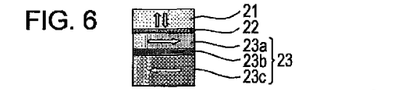
FIG. 6 illustrates magnetization directions of the free magnetization layer 21 and the pinned magnetization layer 23 of the magnetoresistance effect element 2 which are magnetized in directions perpendicular to a layer plane direction according to the present invention.

As the magnetoresistance effect element 2 according to the present invention, the configuration of a TMR element including a free magnetization layer 21 magnetized in directions perpendicular to a magnetic film surface (a pinned magnetization layer 23 is magnetized in an in-plane direction with respect to the film surface of a magnetic layer) is shown in FIG. 6. More specifically, the magnetoresistance effect element 2 includes the free magnetization layer 21, a spacer layer 22, and the pinned magnetization layer 23. In the state in which the layers are stacked on each other in this order, the free magnetization layer 21 and the pinned magnetization layer 23 are disposed between an upper electrode 25 and a lower electrode 26 such that the free magnetization layer 21 is connected to a right electrode 26 and that the pinned magnetization layer 23 is connected to a left electrode 25. In this case, the free magnetization layer 21 is formed of a ferromagnetic material as a magnetosensitive layer. The spacer layer 22 is a non-magnetic spacer layer formed of a non-magnetic material having insulation properties, and serves as a tunnel barrier layer. The spacer layer 22 is formed generally with a thickness of 1 nm or smaller. The lower electrode 25 is connected to a ground.

The free magnetization layer 21 of the magnetoresistance effect element 2 which is magnetized in directions perpendicular to a film surface of a magnetic layer will be discussed below. Concerning the free magnetization layer 21, for a magnetic material having a high coercive force acting in a direction perpendicular to the film surface of the magnetic layer, the composition ratio of the material is changed, an impurity is added to the material, or the thickness of the material is adjusted, thereby decreasing the coercive force. The free magnetization layer 21 may be formed of, for example, a magnetic material having a small magnetic anisotropic energy density, such as CoFeB (cobalt-iron-boron). In order to increase the possibility that a greater resonance motion will occur in the free magnetization layer 21, the size of the free magnetization layer 21 is preferably smaller than a 200 nm square, and the element resistance preferably approximates 50Ω in terms of a DC resistance in order to provide matching with a high frequency transmission circuit. The tunnel barrier layer 22 is preferably formed of monocrystal MgOx (001), and adjustments are more preferably made so that a coherent tunneling effect will be implemented between the tunnel barrier layer 22 and the free magnetization layer 21, and then, a high magnetoresistance change rate can be obtained.

Figure 7:
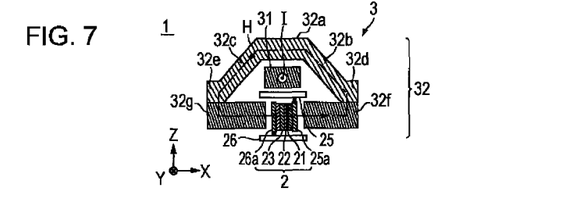
FIG. 7 is a sectional view, taken along line W-W of FIG. 1, of the magnetoresistance effect element 2 magnetized in directions perpendicular to a layer plane direction according to the present invention.

The magnetic-field applying unit 3 includes, as shown in FIG. 1, wiring 31 for magnetic-field generation, a magnetic yoke 32, and a current supply unit 33. The wiring 31 for magnetic-field generation is disposed, as shown in FIG. 7, above the magnetoresistance effect element 2 with the upper electrode 25 therebetween. The magnetic yoke 32 includes an apex magnetic body 32a, lateral magnetic bodies 32b and 32c, lower magnetic bodies 32d and 32e, and bottom magnetic bodies 32f and 32g. In this case, the apex magnetic body 32a is disposed above the wiring 31 for magnetic-field generation. The lateral magnetic body 32b is disposed on one side (for example, a right side in FIG. 7) of the wiring 31 for magnetic-field generation and is connected to the apex magnetic body 32a. The lateral magnetic body 32c is disposed on the other side (for example, a left side in FIG. 7) of the wiring 31 for magnetic-field generation and is connected to the apex magnetic body 32a. The lower magnetic body 32d is disposed on one side (for example, a right side in FIG. 7) of the magnetoresistance effect element 2 and is connected to the lateral magnetic body 32b. The lower magnetic body 32e is disposed on the other side (for example, a left side in FIG. 7) of the magnetoresistance effect element 2 and is connected to the lateral magnetic body 32c. With this configuration, the lower magnetic body 32e, the lateral magnetic body 32c, the apex magnetic body 32a, the lateral magnetic body 32b, and the lower magnetic body 32d are interconnected to each other in this order, and are formed, as a whole, in a strip-like shape. They are also disposed above the magnetoresistance effect element 2, as shown in FIG. 1, such that they stretch over the wiring 31 for magnetic-field generation.

The bottom magnetic body 32f is disposed, as shown in FIG. 7, under the lower magnetic body 32d in a state in which it is connected to the lower magnetic body 32d. An edge portion of the bottom magnetic body 32f facing the magnetoresistance effect element 2 advances between the upper electrode 25 and the lower electrode 26 of the magnetoresistance effect element 2 in a state in which it is insulated from the upper electrode 25 and the lower electrode 26, and reaches an area near one lateral surface of the free magnetization layer 21 of the magnetoresistance effect element 2. The bottom magnetic body 32g is disposed under the lower magnetic body 32e in a state in which it is connected to the lower magnetic body 32e. An edge portion of the bottom magnetic body 32e facing the magnetoresistance effect element 2 also advances between the upper electrode 25 and the lower electrode 26 of the magnetoresistance effect element 2 in a state in which it is insulated from the upper electrode 25 and the lower electrode 26, and reaches an area near the other lateral surface of the free magnetization layer 21 of the magnetoresistance effect element 2.

Figure 8:
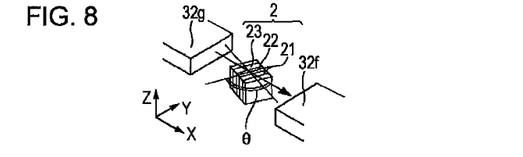
FIG. 8 is a perspective view of an area near the magnetoresistance effect element 2 and bottom magnetic bodies 32f and 32g.

With the above-described configuration, when a current I flows through the wiring 31 for magnetic-field generation, the magnetic yoke 32 forms a closed magnetic circuit for a magnetic field generated around the wiring 31 for magnetic-field generation, and applies a magnetic field H to the free magnetization layer 21 of the magnetoresistance effect element 2 disposed in an area, which is a gap of this closed magnetic circuit (a gap between the pair of bottom magnetic bodies 32f and 32g), as shown in FIG. 8. It is noted that a cap layer 25a for electrically connecting the free magnetization layer 21 of the magnetoresistance effect element 2 and the upper electrode 25 and one via-hole are disposed, and a cap layer 26a for electrically connecting the antiferromagnetic layer 24 and the lower electrode 26 and the other via-hole are disposed. In this example, the above-described wiring 31 for magnetic-field generation and magnetic yoke 32 of the magnetic-field applying unit 3 are formed on a silicon wafer by using a known semiconductor manufacturing process. Similarly, the magnetoresistance effect elements 2 are formed on a silicon wafer by using a known semiconductor manufacturing process and are individually cut. The magnetoresistance effect element 2 is disposed in a gap between the bottom magnetic bodies 32f and 32g of the magnetic yoke 32. The magnetoresistance effect element 2 is rotated so as to increase or decrease a tilting angle θ between the direction of the magnetic field H and the direction of the film surface of the free magnetization layer 21, as indicated by θ in FIG. 8, thereby making it possible to change and tilt a relative angle of the magnetoresistance effect element 2 to the magnetic field H. The magnetoresistance effect element 2 is disposed so that, by providing a magnetic component in a direction perpendicular to the film surface to the free magnetization layer 21, the Q factor of resonance characteristics of the magnetoresistance effect element 2 can be increased.

The current supply unit 33 is connected to both end portions of the wiring 31 for magnetic-field generation extending from both lateral sides of the apex magnetic body 32a, and supplies a current I to the wiring 31 for magnetic-field generation. The current supply unit 33 is configured such that it can change a value of the current I. Accordingly, by changing the value of the current I output from the current supply unit 33, the magnetic-field applying unit 3 changes the strength of the magnetic field H to be applied to the magnetoresistance effect element 2, thereby making it possible to change the resonant frequency f0 of the magnetoresistance effect element 2. In this example, only one piece of wiring 31 for magnetic-field generation which passes through the inside of the magnetic yoke 32 is provided. However, by forming the wiring 31 for magnetic-field generation in a coil-like shape, a plurality of pieces of wiring for magnetic-field generation which pass through the inside of the magnetic yoke 32 may be provided, thereby increasing the strength of the magnetic field H.

Figure 9:
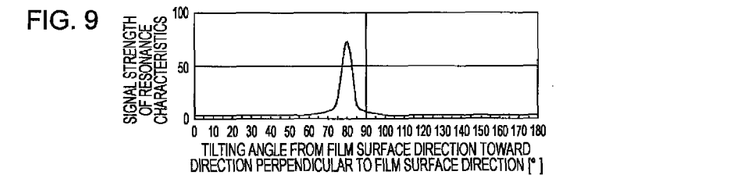
FIG. 9 is a diagram illustrating the signal strength of resonance characteristics obtained when a magnetic field H tilted from a film surface direction toward a direction perpendicular to the film surface direction is applied.

FIG. 9 is a diagram illustrating the signal strength of resonance characteristics obtained when the magnetic field H tilted from a film surface direction toward a direction perpendicular to the film surface direction is applied to the free magnetization layer 21 of the magnetoresistance effect element 2. FIG. 9 shows that the maximum peak of the signal strength is generated when the tilting angle is around 79°. The angle shown in FIG. 9 corresponds to the angle tilted from the film surface direction to a direction perpendicular to the film surface direction shown in FIG. 8. Applying the magnetic field H to the magnetoresistance effect element 2 which is tilted with respect to the advancing direction of the magnetic field H is equivalent to providing magnetization having a vector in a film surface direction and a vector in a direction perpendicular to the film surface direction. The magnetization direction of the pinned magnetization layer 23 of the magnetoresistance effect element 2 is optimally the film surface direction. In contrast, the magnetization direction of the free magnetization layer 21 may be the film surface direction, a direction perpendicular to the film surface direction, or a direction tilting from the film surface direction toward a direction perpendicular to the film surface direction.

In one example, a material exhibiting magnetic anisotropic properties in a film surface direction may be used for the free magnetization layer 21, and when the film is formed, the magnetization direction may be aligned to the film surface direction by performing magnetic field treatment in the film surface direction. In this case, evaluations of the resonance characteristics of the free magnetization layer 21 show the following results. By the application of a strong magnetic field of 5 to 10 K gauss tilting in a direction perpendicular to the film surface direction or in a direction perpendicular to the film surface direction at around 90° to the free magnetization layer 21, a magnetic component in a direction perpendicular to the film surface direction, such a perpendicular direction being an axis of hard magnetization, is provided to the free magnetization layer 21, and also, a magnetic component in a film surface direction which is antiparallel to the magnetization direction of the pinned magnetization layer 23 is provided to the free magnetization layer 21, and then, the Q factor of resonance characteristics is increased. In another example, a material exhibiting magnetic anisotropic properties in a direction perpendicular to the film surface direction may be used for the free magnetization layer 21, and when the layer is formed, the magnetization direction may be aligned to a direction perpendicular to the film surface direction by performing magnetic field treatment in the direction perpendicular to the film surface direction. In this case, evaluations of the resonance characteristics of the free magnetization layer 21 show the following results. By the application of a magnetic field of 2 K gauss or lower tilting at an angle of 5° to 20° or at an angle of 160° to 175°, which is close to the film surface direction, to the free magnetization layer 21, a magnetic component in a direction perpendicular to the film surface direction and a magnetic component in the film surface direction which is antiparallel to the magnetization direction of the pinned magnetization layer 23 are provided to the free magnetization layer 21, and then, the Q factor of resonance characteristics is increased.

As described above, the tilting angle of a magnetic field at which the signal strength of resonance characteristics is maximized is substantially determined due to the magnetic anisotropic properties, the initial magnetization state, and the aspect ratio of the free magnetization layer 21 of the magnetoresistance effect element 2. A magnetic component in a direction perpendicular to the film surface direction and a magnetic component in the film surface direction which is antiparallel to the magnetization direction of the pinned magnetization layer 23 are required. Accordingly, it is necessary to set the positional relationship between the magnetic yoke 32 and the magnetoresistance effect element 2 by finding the angle of the magnetic field H at which the signal strength is maximized from among angles of 5° to 175° of the magnetic field H which is tilted from the film surface direction toward a direction perpendicular to the film surface direction with respect to the free magnetization layer 21 of the magnetoresistance effect element 2. With this configuration, maximum resonance characteristics can be obtained, and a high multiplication signal can be obtained from the mixer 1.

In the impedance circuit 4, the impedance (input/output impedance) for a voltage signal (multiplication signal) S4, which will be discussed, is higher than the impedance (input/output impedance) for the signals S1 and S2. The impedance circuit 4 is disposed between the above-described transmission line L1 (input transmission line) having characteristic impedance of 50 and a transmission line Lm having characteristic impedance of 50Ω and being connected to the magnetoresistance effect element 2 such that the impedance circuit 4 is fit in a small gap formed between the transmission lines L1 and Lm. In this case, in the impedance circuit 4, the impedance for the signals S1 and S2 transmitted through the transmission line L1 is lower than the characteristic impedance (50Ω) of the transmission line L1, and the signals S1 and S2 are output from the transmission line L1 to the transmission line Lm through the use of the low impedance for the signals S1 and S2. That is, the impedance circuit 4 serves as an impedance element which provides a low input/output impedance for signals of a frequency band including the signals S1 and S2, and allows the signals S1 and S2 to pass through the impedance circuit 4 such that the attenuation of the amplitude of the signals S1 and S2 is contained to a minimal level. In contrast, in the impedance circuit 4, the impedance for a signal of a square law detection output (which is a multiplication signal, that is, the voltage signal S4 of a frequency (f1±f2)) generated in the magnetoresistance effect element 2 is set such that the impedance as viewed from the magnetoresistance effect element 2 (input/output impedance) will be the impedance (preferably the impedance of 500Ω or higher) higher than the characteristic impedance (50Ω) of the transmission lines L1 and Lm.

Figure 10:
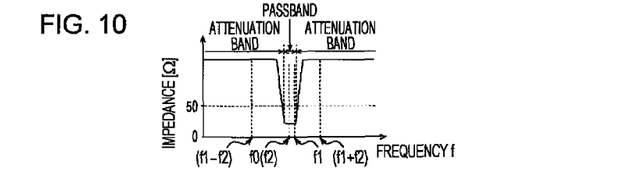
FIG. 10 is a conceptual diagram illustrating impedance characteristics obtained when a band-pass filter is used for an impedance circuit 4.
Figure 11:
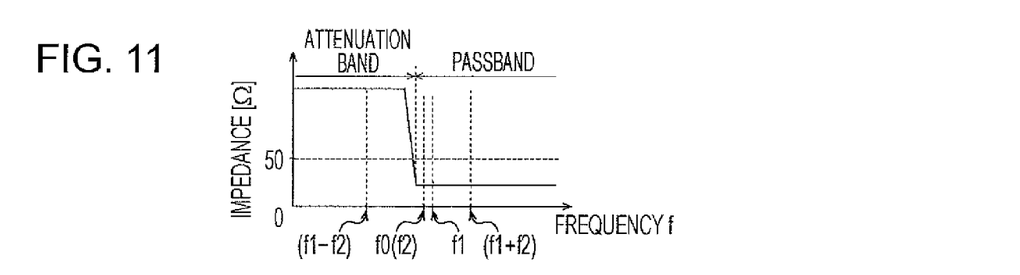
FIG. 11 is a conceptual diagram illustrating impedance characteristics obtained when a high-pass filter is used for the impedance circuit 4.

In the mixer 1, the resonant frequency f0 of the magnetoresistance effect element 2 is set to match the frequency f2 of the local signal S2, and also the frequency f1 of the signal S1 is generally set to be a frequency around the frequency f2, which will be discussed later. Accordingly, in one example, the impedance circuit 4 may be formed as a band-pass filter having impedance characteristics shown in FIG. 10. In another example, the impedance circuit 4 may be formed as a high-pass filter having impedance characteristics shown in FIG. 11. In this case, this band-pass filter is restricted to have impedance characteristics in which, as shown in FIGS. 10 and 11, the resonant frequency f0 of the magnetoresistance effect element 2 (the frequency f2 of the local signal S2) and the frequency f1 of the signal S1 are included in a passband and frequencies (f1+f2), (f1−f2), 2×f1, 2×f2, 3×f1, 3×f2, and so on, of multiplication signals generated in the magnetoresistance effect element 2 as a square law detection output are included in an attenuation band. The impedance circuit 4 also includes, for example, a capacitor, and has a function of preventing DC components of a square law detection output generated in the magnetoresistance effect element 2 from leaking to the amplifier 11 or the signal generator 12.

In one example, the impedance conversion circuit 5 includes an operational amplifier 5a. In this example, the operational amplifier 5a functions as a differential amplifier with one input terminal of the operational amplifier 5a being connected to the upper electrode 25 and the other input terminal thereof being connected to a ground. With this configuration, the operational amplifier receives the voltage signal S4 which has been generated across the magnetoresistance effect element 2 from the input of the signal S1 and the local signal S2 via a capacitor 4a, amplifies the voltage signal S4, and outputs the amplified voltage signal as the output signal S5 to an output transmission line L2 (for example, a microstrip line, and hereinafter may be referred to as a "transmission line L2"). The operational amplifier 5a generally has characteristics in which the input impedance is very high and the output impedance is sufficiently low. Accordingly, with this configuration, the operational amplifier 5a receives the voltage signal S4 generated across the magnetoresistance effect element 2 with the input impedance higher than the output impedance, amplifies the received voltage signal S4 to the output signal S5, and outputs the output signal S5 with the low impedance. Thus, the operational amplifier 5a serves as an impedance converter. In this case, the operational amplifier 5a outputs the output signal S5 with the output impedance which matches the characteristic impedance of the output transmission line L2. In one example, the filter 13 is formed as a band-pass filter (BPF: second filter) and is disposed in the transmission line L2. The filter 13 allows a signal only having a desired frequency to pass through the filter 13, thereby outputting the signal as the multiplication signal S3 to the output terminal 14. More specifically, the filter 13 allows a signal having one (desired frequency) of the frequencies (f1−f2) and (f1+f2) to pass through the filter 13.

Figure 12:
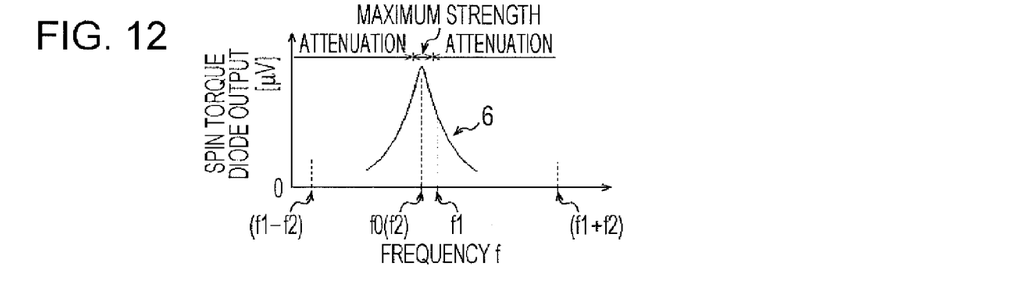
FIG. 12 shows resonance characteristics of the magnetoresistance effect element 2 obtained when a magnetic field H applied to the magnetoresistance effect element 2 is maintained at a fixed value and spectrum waveforms of a first high frequency signal S1 (frequency f1) and a second high frequency signal S2 (frequency f2) for a local signal within a region of a resonant frequency f0 of the resonance characteristics, and illustrates the relationships between the frequencies and the resonance characteristics when f1 and f2 take values around 3 GHz, 3.5 GHz, 4 GHz, and 4.5 GHz.

A description will now be given of a mixing operation of the mixer 1 and a frequency conversion operation of the frequency converter 100. In one example, an RF signal $S_{RF}$ received via the antenna 101 (frequency f1=4.05 GHz) is input, and the signal generator 12 generates a local signal S2 (frequency f2=4.0 GHz (<f1)). The impedance circuit 4 includes a chip capacitor 4a, which is the least expensive one, and the frequencies f1 and f2 of the signals S1 and S2, respectively, are included in the passband of the impedance circuit 4. Additionally, as shown in FIG. 12, it is preferable that the resonance characteristics of the magnetoresistance effect element 2 are maximized with respect to the frequency f2 of the local signal S2. Thus, the value of the current I to be supplied from the current supply unit 33 to the wiring 31 for magnetic-field generation is set to be a value which allows a magnetic field H that causes the resonant frequency f0 to coincide with the frequency f2 of the local signal S2 to be applied to the magnetoresistance effect element 2. Power of the local signal S2 is set to be power (for example, −15 dBm±5 dBm) which is capable of supplying a current that can generate resonance in the magnetoresistance effect element 2. The output signal S5 output from the differential amplifier as a result of the mixing operation of the mixer 1 includes frequency components (f1, f2) of the signals S1 and S2, respectively, and frequency components ((f1+f2), (f1−f2), 2×f1, 2×f2, 3×f1, 3×f2, and so on) of the multiplication signals. Among these frequency components, the filter 13 may allow a desired frequency component (a frequency component (f1+f2) or a frequency component (f1−f2)) to pass through the filter 13. In this example, the filter 13 is configured such that it allows a lower frequency component (f1−f2) to pass through the filter 13 and stops the signals having the other frequency components from passing through the filter 13. In this case, the filter 13 is formed as a band-pass filter. However, the filter 13 may be formed as a low-pass filter.

In this frequency converter 100, in a state in which the current I is being supplied from the current supply unit 33 (a state in which the magnetic field H is being applied to the magnetoresistance effect element 2), the local signal S2 (frequency f2) is input from the signal generator 12 to the mixer 1. In this case, the local signal S2 passes through the impedance circuit 4 (capacitor 4a) with a very small attenuation and is output to the magnetoresistance effect element 2. The local signal S2 is set such that the frequency f2 of the local signal S2 coincides with the resonant frequency f0 of the magnetoresistance effect element 2 and such that power of the local signal S2 causes the magnetoresistance effect element 2 to generate the maximum resonance. At this time, the RE signal $S_{RF}$ (frequency f1) is input from the antenna 101 to the amplifier 11, and when the amplifier 11 starts to output the signal S1, the magnetoresistance effect element 2 performs a square law detecting operation on the two signals S1 and S2. In this case, the signal S1 passes through the impedance circuit 4 (capacitor 4a) with a very small attenuation without being reflected on the impedance circuit 4, and is output to the magnetoresistance effect element 2.

In this case, in comparison with a semiconductor pn junction diode, the magnetoresistance effect element 2 performs a square law detecting operation (rectifying operation) in a resonance state with a small forward voltage. Accordingly, even if power of the local signal S2 for generating this forward voltage in the magnetoresistance effect element 2 is smaller than power (for example, 10 dBm) required when a semiconductor pn junction diode is used, the magnetoresistance effect element 2 performs a square law detecting operation so as to multiply the signal S1 by the local signal S2, thereby generating the voltage signal S4 across the magnetoresistance effect element 2. At this time, even if a DC voltage is generated in the magnetoresistance effect element 2, the capacitor 4a stops the DC voltage from leaking to the antenna or the signal generator 12 (cuts the DC voltage), thereby protecting the antenna and the signal generator 12 as well as the magnetoresistance effect element 2.

The voltage signal S4 generated by a square law detecting operation (mixing operation) performed by the magnetoresistance effect element 2 is constituted by various frequency components including the two frequency components (f1+f2, f1−f2), as stated above, and these frequency components are frequency components included in the attenuation band, which is out of the passband of the capacitor 4a. Accordingly, the impedance of the capacitor 4a (that is, the impedance circuit 4) for the frequency components (f1+f2, f1−f2) is greater than the impedance of the capacitor 4a for the signal S1 (frequency f1) and the local signal S2 (frequency f2). In particular, the impedance of the capacitor 4a for a frequency component of the same frequency (f1−f2=50 MHz) as that of the multiplication signal S3 output from the frequency converter 100 of this example is a value higher than 1000Ω. Moreover, as stated above, the input impedance of the operational amplifier 5a forming the impedance conversion circuit 5 connected to the magnetoresistance effect element 2 is a very high value (generally, several hundreds of KΩ or higher). Accordingly, since the impedance of the transmission line Lm to which the voltage signal S4 is output by the magnetoresistance effect element 2 is a high value (exceeding 1000Ω), the magnetoresistance effect element 2 generates a high level of the voltage signal S4 and outputs it to the transmission line Lm.

Figure 13:
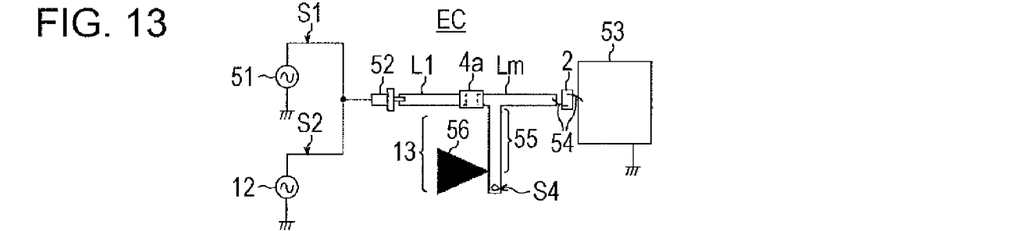
FIG. 13 is a diagram of an evaluation system including an evaluation based circuit board for evaluating the mixer 1.

In one example, by using an evaluation based circuit board EC shown in FIG. 13, the voltage signal S4 generated in the mixer 1 was evaluated. This evaluation based circuit board EC includes: a network analyzer (made by Agilent Technologies, Inc. model name 8720ES) 51 that generates and outputs a signal S1; a signal generator (made by Agilent Technologies, Inc. model name 83620B), which is used as the signal generator 12, that generates and outputs a local signal S2; a BNC terminal 52 which is connected to the network analyzer 51 and the signal generator 12 with a coaxial cable and which is also connected to a transmission line L1 and outputs the signals S1 and S2 to the transmission line L1; the transmission line L1 formed of a microstrip line and connecting the BNC terminal 52 and a capacitor 4a; the capacitor 4a (made by TDK Corporation: 1005 chip capacitor (4 pF)); a transmission line Lm formed of a microstrip line and connecting the capacitor 4a and a magnetoresistance effect element 2; the magnetoresistance effect element 2 connected between the transmission line Lm and a ground plane 53 with a bonding wire 54; and a filter 13 which is formed as a cut filter using a λ/4 stub line 55 connected to the transmission line Lm and a sector λ/4 stub 56 connected to the λ/4 stub line 55 and which outputs the voltage signal S4. In the λ/4 stub line 55 and the sector λ/4 stub 56, λ is a wavelength of the local signal S2 (frequency f2). Among the above-described frequency components included in the signals generated by the magnetoresistance effect element 2, the signal levels of the frequency components f1 and f2 are much higher than those of the other frequency components (f1+f2), (f1−f2), 2×f1, 2×f2, 3×f1, 3×f2, and so on, and thus, it is necessary to attenuate the frequency components f1 and f2. In this case, the frequency f1 of the signal S1 is close to the frequency f2 of the local signal S2. Thus, the length λ/4 of a resonator which attenuates the local signal S2 is set as a length effective in attenuating both the frequency components f1 and f2.

The magnetoresistance effect element 2 installed in this evaluation based circuit board EC is configured such that a magnetization component in a direction perpendicular to the film surface direction is applied from the magnetic-field applying unit 3 to the magnetoresistance effect element 2. Accordingly, the magnetoresistance effect element 2 can obtain resonance characteristics having a high Q factor and thereby outputs a high multiplication signal. Moreover, by adjusting the magnetic field H generated from the magnetic-field applying unit 3 to tilt at an angle of 5° to 175° from the film surface direction toward a direction perpendicular to the film surface direction with respect to the free magnetization layer 21 of the magnetoresistance effect element 2, the magnetoresistance effect element 2 can obtain resonance characteristics having an even higher Q factor, and the highest multiplication signal can be obtained. The high Q factor makes it possible to increase reception performance (sensitivity and frequency selectivity).

Figure 14A:
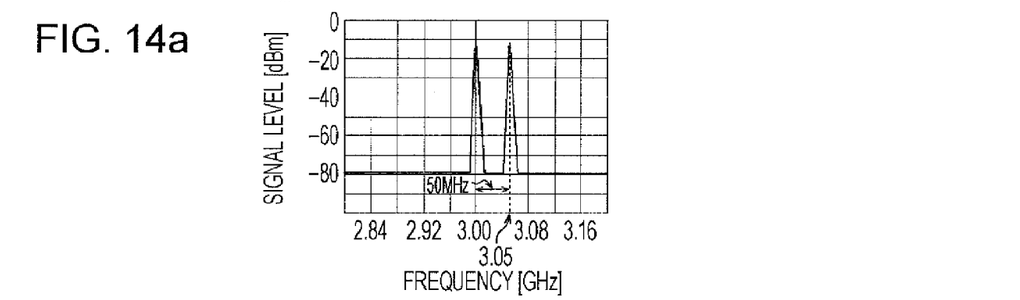
FIG. 14a shows a spectrum waveform of a 3 GHz signal S1 and a 3.05 GHz local signal S2.
Figure 14B:
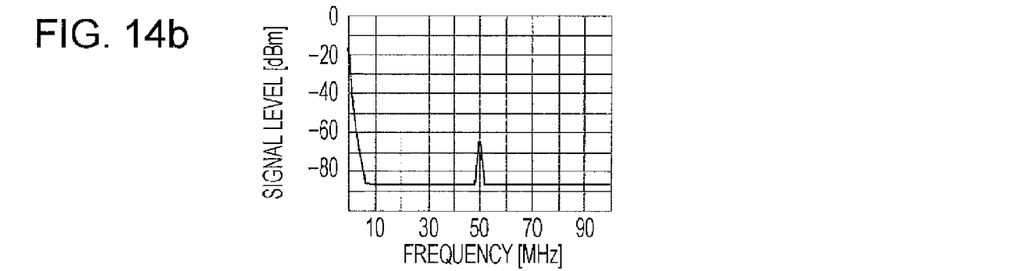
FIG. 14b shows a spectrum waveform of a voltage signal (multiplication signal) S4 when a 3 GHz signal S1 and a 3.05 GHz local signal S2 are input.

According to the evaluations obtained by using the evaluation based circuit board EC of this embodiment, when a signal S1 having a signal level of −15 dBm (frequency f1=3.05 GHz) and a local signal S2 having a signal level of −15 dBm (frequency f2=3.0 GHz) are input, as shown in FIG. 14a, the magnetoresistance effect element 2 is able to generate a voltage signal S4 having a signal level of −65 dBm (a level of frequency (f1−f2)=50 MHz), as shown in FIG. 14b, also due to the fact that the impedance of the transmission line Lm is maintained at a high value.

Figure 15A:
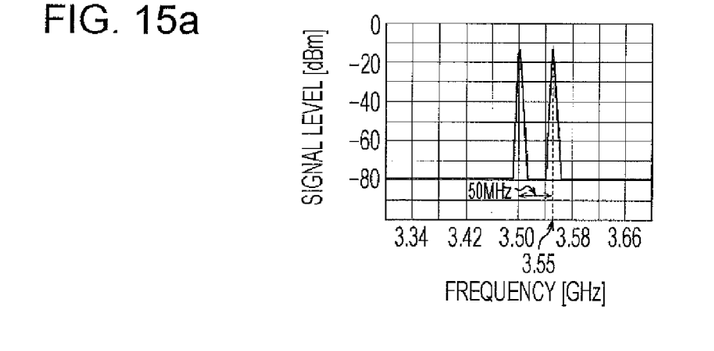
FIG. 15a shows a spectrum waveform of a 3.5 GHz signal S1 and a 3.55 GHz local signal S2.
Figure 15B:
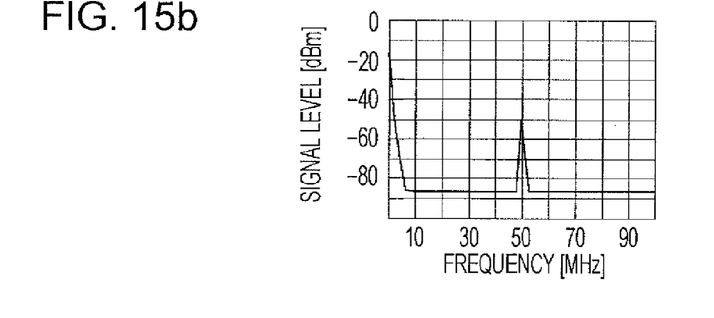
FIG. 15b shows a spectrum waveform of a voltage signal (multiplication signal) S4 when a 3.5 GHz signal S1 and a 3.55 GHz local signal S2 are input.

Similarly, by using the evaluation based circuit board EC, when a signal S1 having a signal level of −15 dBm (frequency f1=3.55 GHz) and a local signal S2 having a signal level of −15 dBm (frequency f2=3.5 GHz) are input, as shown in FIG. 15a, the magnetoresistance effect element 2 is able to generate a voltage signal S4 having a signal level of −50 dBm (a level of frequency (f1−f2)=50 MHz), as shown in FIG. 15b.

Figure 16A:
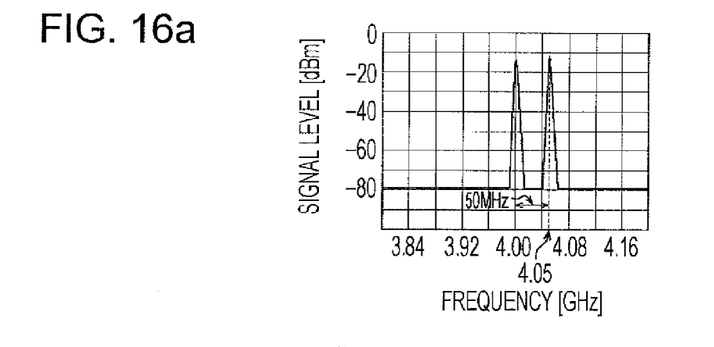
FIG. 16a shows a spectrum waveform of a 4 GHz signal S1 and a 4.05 GHz local signal S2.
Figure 16B:
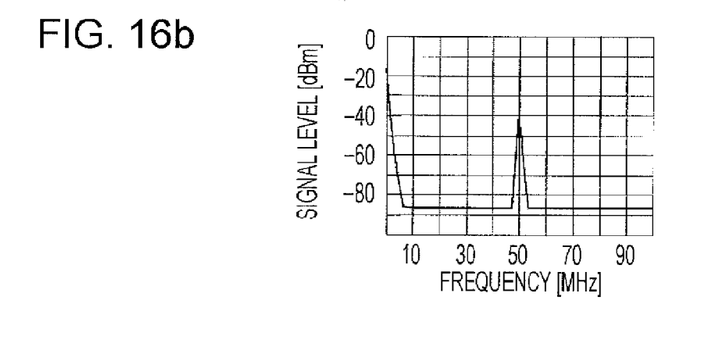
FIG. 16b shows a spectrum waveform of a voltage signal (multiplication signal) S4 when a 4 GHz signal S1 and a 4.05 GHz local signal S2 are input.

Similarly, by using the evaluation based circuit board EC, when a signal S1 having a signal level of −15 dBm (frequency f1=4.05 GHz) and a local signal S2 having a signal level of −15 dBm (frequency f2=4.0 GHz) are input, as shown in FIG. 16a, the magnetoresistance effect element 2 is able to generate a voltage signal S4 having a signal level of −42 dBm (a level of frequency (f1−f2)=50 MHz), as shown in FIG. 16b.

Figure 17A:
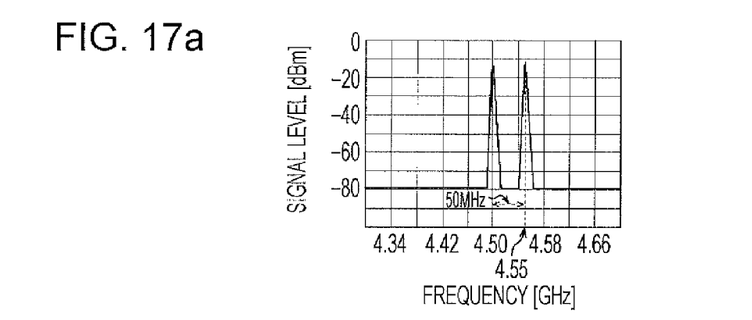
FIG. 17a shows a spectrum waveform of a 4.5 GHz signal S1 and a 4.55 GHz local signal S2.
Figure 17B:
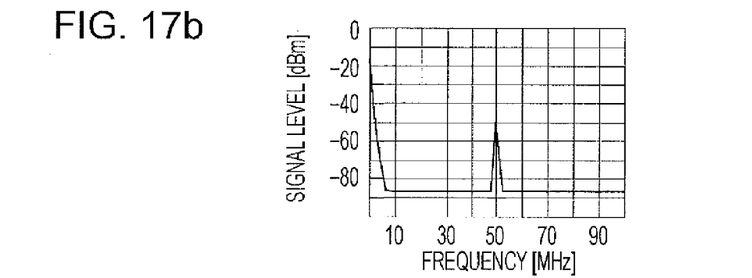
FIG. 17b shows a spectrum waveform of a voltage signal (multiplication signal) S4 when a 4.5 GHz signal S1 and a 4.55 GHz local signal S2 are input.

Similarly, by using the evaluation based circuit board EC, when a signal S1 having a signal level of −15 dBm (frequency f1=4.55 GHz) and a local signal S2 having a signal level of −15 dBm (frequency f2=4.5 GHz) are input, as shown in FIG. 17a, the magnetoresistance effect element 2 is able to generate a voltage signal S4 having a signal level of −50 dBm (a level of frequency (f1−f2)=50 MHz), as shown in FIG. 17b.

Figure 18:
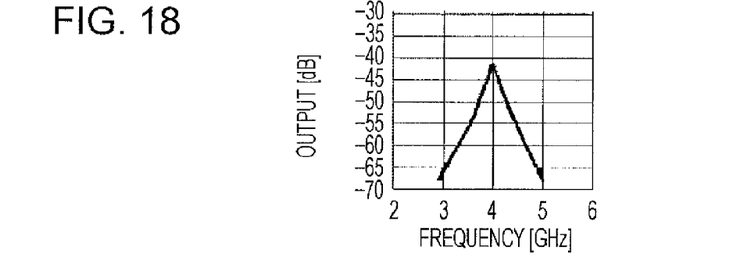
FIG. 18 shows a spectrum waveform of an attenuation curve (band-pass filter) of a voltage signal (multiplication signal) S4 with respect to the frequency of a signal S1 when the magnetic field H applied to the magnetoresistance effect element 2 is maintained at a fixed value.

A graph obtained by plotting a change in the voltage signal S4 (a level of frequency (f1−f2)=50 MHz) when the signal S1 and the local signal S2 are set to be around 3.0 GHz, 3.5 GHz, 4.0 GHz, and 4.5 GHz is shown in FIG. 18. This change in the magnitude of the voltage signal S4 indicates frequency selectivity corresponding to the resonance characteristics of the magnetoresistance effect element 2, as shown in FIG. 5. In this example, when the frequency peak of the resonance characteristics of the magnetoresistance effect element 2 is 4 GHz, if the signal S1 and the local signal S2 at around 4 GHz, which is the same as the frequency peak of the magnetoresistance effect element 2, are input, the voltage signal S4 exhibits the maximum strength, and if the signal S1 and the local signal S2 deviate from 4 GHz, the voltage signal S4 attenuates. This fact shows that there is a certain peak of the signal strength around 4 GHz, and the same effect as that when the signals pass through a band-pass filter can be obtained. These band-pass filter characteristics generated by a square law detecting operation (mixing operation) performed by the magnetoresistance effect element 2 produce a great influence on the Q factor of the resonance characteristics and the level of a multiplication signal due to the magnetic field H generated by the magnetic-field applying unit 3 and applied to the magnetoresistance effect element 2. Since a magnetization component in a direction perpendicular to the film surface direction is applied to the free magnetization layer 21, resonance characteristics having a high Q factor can be obtained, and the above-described band-pass filter characteristics having a narrow passband can be obtained. Moreover, the positional relationship between the magnetoresistance effect element 2 and the magnetic-field applying unit 3 is determined so that the angle of the magnetic field H generated from the magnetic-field applying unit 3 with respect to the free magnetization layer 21 will be an angle tilted in a range of 5° to 175° from the film surface direction toward a direction perpendicular to the film surface direction. Accordingly, an even higher Q factor, which is 100 or higher, can be obtained, and the above-described band-pass filter characteristics having an even narrower passband can be obtained. In order to apply such band-pass filter characteristics to a communication band-pass filter, it is necessary that the above-described band-pass filter characteristics generated by a square law detecting operation (mixing operation) performed by the magnetoresistance effect element 2 achieve a Q factor of 100 or higher and have a narrow passband.

Figure 19:
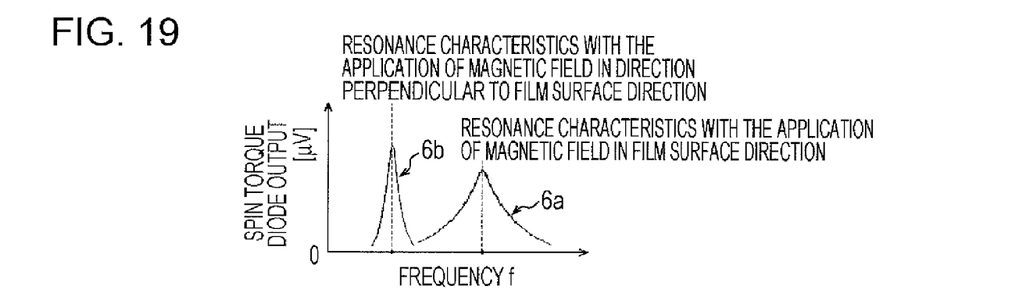
FIG. 19 illustrates the relationship between resonance characteristics of the magnetoresistance effect element 2 obtained when the magnetic field H is applied in a film surface direction and those obtained when the magnetic field H is applied in a direction perpendicular to the film surface direction.

FIG. 19 is a diagram illustrating the relationship between resonance characteristics of the magnetoresistance effect element 2 obtained when the magnetic field H is applied in the film surface direction and resonance characteristics of the magnetoresistance effect element 2 obtained when the magnetic field H is applied in a direction perpendicular to the film surface direction. By applying the magnetic field H in a direction perpendicular to the film surface direction, resonance characteristics having a high Q factor can be obtained and the above-described band-pass filter characteristics exhibiting an even narrower passband can be obtained.

In this example, the operational amplifier 5a forming the impedance conversion circuit 5 amplifies the voltage signal S4 and outputs it as the output signal S5 to the transmission line L2. Then, the filter 13 allows one (intermediate frequency: f1−f2) of two frequency components (f1+f2, f1−f2) included in the output signal S5 to pass through the filter 13, and outputs the frequency component to the output terminal 14 as the multiplication signal S3. With this operation, the desired multiplication signal S3 (frequency (f1−f2)) extracted from the voltage signal (multiplication signal) S4 obtained by multiplying the signal S1 (frequency f1) with the local signal S2 (frequency f2) is output from the mixer 1.

In this manner, in the mixer 1 and the frequency converter 100, the impedance circuit 4 disposed between the transmission line L1 and the magnetoresistance effect element 2 outputs the signal S1 (frequency f1) and the local signal S2 (frequency f2), which are received via the transmission line L1, to the magnetoresistance effect element 2 through the use of the impedance of the impedance circuit 4, which is lower than the characteristic impedance of the transmission line L1. Thus, the signal S1 and the local signal S2 can be output to the magnetoresistance effect element 2 with only a small attenuation. On the other hand, in a frequency band of the voltage signal (multiplication signal) S4 generated by the magnetoresistance effect element 2, the output impedance higher than the impedance for the signals S1 and S2 is utilized. Thus, by using the mixer 1 and the frequency converter 100, since the signal S1 and the local signal S2 can be output to the magnetoresistance effect element 2 with only a small attenuation, the multiplication signal S3 (frequency component (f1−f2)) can be output by mixing (multiplying) the signal S1 with (by) the local signal S2 by using the local signal S2 having lower power, in other words, by multiplying the signal S1 by the local signal S2 by using smaller power. As a result, power saving can further be enhanced. Additionally, since the impedance used in the impedance circuit 4 for the frequency band of the voltage signal (multiplication signal) S4 generated by the magnetoresistance effect element 2 is high, it is possible to prevent a decrease (attenuation) in the voltage signal (multiplication signal) S4 generated by the magnetoresistance effect element 2, and as a result, a decrease in the output of the multiplication signal S3 can also be prevented.

In the mixer 1 and the frequency converter 100, the impedance circuit 4 is constituted by a first filter (band-pass filter, in this example, the capacitor 4a) in which, among frequency components included in the voltage signal S4, the frequencies f1 and f2 of the signal S1 and the local signal S2, respectively, are included in the passband and the frequencies of the multiplication signals (f1−f2, f1+f2, 2×f1, 2×f2, 3×f1, 3×f2, and so on) are included in the attenuation band. Accordingly, the first filter can be constituted by passive elements, such as capacitors, stubs, or resonators, which will be discussed later. Thus, power saving can further be enhanced than when the impedance circuit 4 is constituted by active elements. Additionally, the filter (first filter) is constituted by the single capacitor 4a whose self-resonant frequency band is set to be the above-described passband, thereby making it possible to simplify the configurations of the mixer 1 and the frequency converter 100.

In the mixer 1 and the frequency converter 100, the following impedance conversion circuit 5 is provided. The impedance conversion circuit 5 receives the voltage signal (multiplication signal) S4 by using the input impedance higher than the characteristic impedance of the transmission line Lm and outputs the voltage signal S4 by using the output impedance which matches the characteristic impedance of the transmission line L2. By the provision of this impedance conversion circuit 5, even if the characteristic impedance of the transmission line L2 is low, it is possible to prevent a decrease (attenuation) in the voltage signal (multiplication signal) S4 generated by the magnetoresistance effect element 2, and as a result, it is also possible to prevent a decrease in the output of the multiplication signal S3.

The present invention is not restricted to the above-described configuration, and various configurations may be employed. For example, one amplifier (for example, an operational amplifier) may form the impedance conversion circuit 5 and the filter 13, though it is not shown. In this configuration, the upper limit frequency of an amplifying operation of this amplifier is set between the frequency (f1−f2) of the multiplication signal S3 and the frequency f2 of the local signal S2. With this configuration, this amplifier is able to input the voltage signal S4 generated by mixing (multiplying) the signal S1 with (by) the local signal S2 in the magnetoresistance effect element 2 by using the high impedance, and is able to output the voltage signal S4 as the multiplication signal S3 by attenuating, among the frequency components (f1−f2, f2, f1, f1+f2, 2×f1, 2×f2, 3×f1, 3×f2, and so on) included in the voltage signal S4, the frequency components in a higher band (f2, f1, f1+f2, 2×f1, 2×f2, 3×f1, 3×f2, and so on) and by allowing only the frequency component (f1−f2) in a lower band to pass through the amplifier while amplifying (buffering) the frequency component (f1−f2). As a result, it is possible to increase the simplicity of the configurations of the mixer 1 and the frequency converter 100.

The present invention is not restricted to the above-described configuration, and various configurations may be employed. In the above-described example, as the magnetoresistance effect element 2, a TMR element, such as an MgO-TMR element, is used. However, another magnetoresistance effect element, such as a CPP-GMR (Current-Perpendicular-to-Plane giant magnetoresistance) element, may be used. As the material of the spacer layer 22, an insulator, a metal, or a semiconductor may be used. For example, as the insulator, MgO, Al2O3, or TiO may be used. As the metal, Cu, Ag, Au, Cr, or an alloy material including at least one of these elements may be used. As the semiconductor, an oxide semiconductor may be used, for example, zinc oxide, gallium oxide, tin oxide, indium oxide, or indium tin oxide (ITO) may be used. Films of a spacer layer using a semiconductor are formed such that the above-described oxide semiconductor is sandwiched between first and second non-magnetic films (one of metals Cu, Ag, Au, Cr, and Zn or an alloy thereof).

In the above-described example, the strength of the magnetic field H applied from the magnetic-field applying unit 3 to the magnetoresistance effect element 2 is variable. However, if the frequency f2 of the local signal S2 is fixed, the strength of the magnetic field H generated by the magnetic-field applying unit 3 can also be fixed. Accordingly, the magnetic-field applying unit 3 may be constituted by a permanent magnet, so that the strength of the magnetic field can be maintained at a constant value. With this configuration, the magnetic-field applying unit 3 can be formed with a simple structure, thereby making it possible to reduce the manufacturing cost.

REFERENCE SIGNS LIST 1 mixer
2 magnetoresistance effect element
3 magnetic-field applying unit
4 impedance circuit
4a capacitor
5 impedance conversion circuit
5a operational amplifier
6a resonance characteristics of magnetoresistance effect element obtained by the application of magnetic field H in film surface direction
6b resonance characteristics of magnetoresistance effect element obtained by the application of magnetic field H in direction perpendicular to film surface direction
11 RF amplifier
12 signal generator for local signal
13 filter
21 free magnetization layer
22 spacer layer
23 pinned magnetization layer
100 frequency converter
H magnetic field
$S_{RF}$ RE signal
S1 signal
S2 local signal
S3 multiplication signal
S4 multiplication signal output from magnetoresistance effect element
S5 multiplication signal output from magnetoresistance effect element and amplified by amplifier disposed in the subsequent stage

The invention claimed is:

1. A mixer comprising:
a magnetoresistance effect element that includes a pinned magnetization layer, a free magnetization layer, and a non-magnetic spacer layer disposed between, in a direction perpendicular to a film surface of the free magnetization layer, the pinned magnetization layer and the free magnetization layer, and that generates, in response to an input of a first high frequency signal and a second high frequency signal for a local signal, a multiplication signal by multiplying both the high frequency signals by each other using a magnetoresistance effect; and
a magnetic-field applying unit that applies a magnetic field to the free magnetization layer,
wherein the magnetic field generated by the magnetic-field applying unit is applied to the film surface of the free magnetization layer in the direction perpendicular to the film surface of the free magnetization layer so that a magnetization component in a direction perpendicular to the film surface will be provided to the free magnetization layer to increase a Q factor of resonance characteristic of the magnetoresistance effect element.

2. The mixer according to claim 1, wherein the magnetoresistance effect element and the magnetic-field applying unit are located so that an angle of the magnetic field generated by the magnetic-field applying unit with respect to the free magnetization layer will be an angle tilted in a range of 5° to 175° from a direction of the film surface toward a direction perpendicular to the direction of the film surface.

3. The mixer according to claim 1, wherein resonance characteristics having a Q factor of 100 or higher are generated in the free magnetization layer by providing a magnetization component applied by the magnetic-field applying unit in the direction perpendicular to the film surface of the free magnetization layer, so that the multiplication signal of the first high frequency signal and the second high frequency signal for the local signal is obtained.

4. The mixer according to claim 1, further comprising:
an impedance circuit in which impedance for the multiplication signal is higher than impedance for the first high frequency signal and the second high frequency signal for a local signal, the impedance circuit being disposed between an input transmission line through which the first high frequency signal and the second high frequency signal for a local signal are transmitted and the magnetoresistance effect element,
wherein the impedance circuit is constituted by a filter in which the frequencies of the first high frequency signal and the second high frequency signal for a local signal are included in a passband and frequencies of the multiplication signal are included in an attenuation band.

5. The mixer according to claim 1, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

6. The mixer according to claim 2, wherein resonance characteristics having a Q factor of 100 or higher are generated in the free magnetization layer by providing a magnetization component applied by the magnetic-field applying unit in a direction perpendicular to the film surface to the free magnetization layer, so that the multiplication signal of the first high frequency signal and the second high frequency signal for the local signal is obtained.

7. The mixer according to claim 2, further comprising:
an impedance circuit in which impedance for the multiplication signal is higher than impedance for the first high frequency signal and the second high frequency signal for a local signal, the impedance circuit being disposed between an input transmission line through which the first high frequency signal and the second high frequency signal for a local signal are transmitted and the magnetoresistance effect element, wherein the impedance circuit is constituted by a filter in which the frequencies of the first high frequency signal and the second high frequency signal for a local signal are included in a passband and frequencies of the multiplication signal are included in an attenuation band.

8. The mixer according to claim 3, further comprising:
an impedance circuit in which impedance for the multiplication signal is higher than impedance for the first high frequency signal and the second high frequency signal for a local signal, the impedance circuit being disposed between an input transmission line through which the first high frequency signal and the second high frequency signal for a local signal are transmitted and the magnetoresistance effect element,
wherein the impedance circuit is constituted by a filter in which the frequencies of the first high frequency signal and the second high frequency signal for a local signal are included in a passband and frequencies of the multiplication signal are included in an attenuation band.

9. The mixer according to claim 6, further comprising:
an impedance circuit in which impedance for the multiplication signal is higher than impedance for the first high frequency signal and the second high frequency signal for a local signal, the impedance circuit being disposed between an input transmission line through which the first high frequency signal and the second high frequency signal for a local signal are transmitted and the magnetoresistance effect element,
wherein the impedance circuit is constituted by a filter in which the frequencies of the first high frequency signal and the second high frequency signal for a local signal are included in a passband and frequencies of the multiplication signal are included in an attenuation band.

10. The mixer according to claim 2, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

11. The mixer according to claim 3, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

12. The mixer according to claim 6, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

13. The mixer according to claim 4, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

14. The mixer according to claim 7, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

15. The mixer according to claim 8, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

16. The mixer according to claim 9, further comprising:
an impedance conversion circuit that inputs the multiplication signal and outputs the multiplication signal with output impedance which matches characteristic impedance of an output transmission line to the output transmission line, input impedance being set to be a value higher than a value of the output impedance.

* * * * *